United States Patent [19]
Link et al.

[11] Patent Number: 5,315,260
[45] Date of Patent: May 24, 1994

[54] APPARATUS FOR CONVERTING AN AC COMPONENT OF A SIGNAL TO A SQUARE WAVE

[75] Inventors: Hermann Link, Obereschach; Walter Sturm, Ebersbach/Fils, both of Fed. Rep. of Germany

[73] Assignee: Deutsche Thomson-Brandt GmbH, Villingen-Schwenningen, Fed. Rep. of Germany

[21] Appl. No.: 642,964

[22] Filed: Jan. 18, 1991

Related U.S. Application Data

[63] Continuation of PCT/EP89/00800, Jul. 11, 1989.

[30] Foreign Application Priority Data

Jul. 20, 1988 [DE] Fed. Rep. of Germany ....... 3824557

[51] Int. Cl.⁵ .................. H03K 5/00; H03K 5/153; H03K 5/08
[52] U.S. Cl. .............................. 328/28; 328/1; 307/261; 307/359
[58] Field of Search ............... 307/261, 515, 519, 358, 307/359; 328/28, 31, 1, 5

[56] References Cited

U.S. PATENT DOCUMENTS

| | | | |
|---|---|---|---|
| 3,836,791 | 9/1974 | Galloway | 307/359 |
| 3,852,673 | 12/1974 | Guyot et al. | 307/519 |
| 4,682,049 | 7/1987 | Kirschner et al. | 328/5 |
| 4,686,385 | 8/1987 | Sharpe | 307/261 |
| 4,866,298 | 9/1989 | Kniss et al. | 328/5 |
| 4,868,909 | 9/1989 | Löwel | 307/309 |
| 4,922,126 | 5/1990 | Löwel | 307/358 |
| 5,015,879 | 5/1991 | Lasagna et al. | 328/5 |

FOREIGN PATENT DOCUMENTS

| | | |
|---|---|---|
| 0057766A2 | 8/1982 | European Pat. Off. |
| 0087501A2 | 9/1983 | European Pat. Off. |
| 59-5962 | 1/1984 | Japan. |

*Primary Examiner*—Jin F. Ng
*Assistant Examiner*—Sinh Tran
*Attorney, Agent, or Firm*—Joseph S. Tripoli; Joseph J. Laks; Sammy S. Henig

[57] ABSTRACT

An output signal of a magnetoelectrical transducer of a capstan DC motor used in a magnetic tape recorder includes a DC offset voltage. The output signal of the transducer is coupled to a non-inverting input of a first operational amplifier. The output signal is also coupled to an inverting input of a second operational amplifier, operating as a comparator. The non-inverting input of the second operational amplifier is coupled to an output terminal of the first operational amplifier that amplifies an AC voltage component of the transducer output signal. By means of two anti-parallel coupled diodes in a negative feedback branch of the first operational amplifier, a DC amplification of unity is obtained as soon as a first peak of the output signal of the transducer is reached.

16 Claims, 2 Drawing Sheets

APPARATUS FOR CONVERTING AN AC COMPONENT OF A SIGNAL TO A SQUARE WAVE

This application is a continuation of an international application, PCT/EP89/00800, filed Jul. 11, 1989, designating the United States and claiming priority from a German Patent Application filed Jul. 20, 1988, Ser. No. P 38 24 557.4.

The invention relates to an apparatus for converting an alternating current (AC) component of a signal to a square wave signal.

An operational amplifier is a direct current (DC) voltage amplifier with high amplification having an input stage that is arranged as a differential amplifier. When an operational amplifier is used as a voltage amplifier of an AC voltage component of an input signal, a DC voltage component, referred to herein as DC offset, that is superimposed upon the AC voltage component of the input signal, may cause a DC voltage shift at the output of the amplifier. Such DC voltage shift may be undesirable for certain applications, for example, when the output signal of the amplifier is DC coupled to an input of another amplifier. It is known to eliminate such DC voltage shift through capacitive coupling or, when the magnitude of the DC offset is known, by applying a predetermined compensating voltage. It may be desirable to compensate for such effect of the DC offset, automatically, without resorting to AC-coupling, in a situation in which the actual magnitude of the DC offset is not known in advance. It may also be desirable to effectuate such compensation without a significant delay time after the generation of the input signal is initiated.

In a published European Patent Application No. EP-A-O 087501 entitled TRIGGERSCHALTUNG, the inventor being R. Hankel, a trigger circuit is described which derives the components at high frequencies from a signal composition comprising high and low frequencies and converts the components at the high frequency to square wave impulses.

In an arrangement embodying an aspect of the invention, magnetic field sensitive sensors are used to produce a signal that is indicative of the commutation time of a DC motor having a rotor with magnetic pole pairs. Such DC motor may be used, for example, as a capstan motor in a video tape recorder (VTR). The signal produced by the sensors includes an AC voltage component, having a constant and known amplitude, superimposed on a larger DC offset having an unknown value.

It may be desirable to produce a square wave voltage from the AC voltage component of the signal that is produced by the sensors such that the effect of the DC offset on the square wave voltage is reduced. For that purpose, the signal produced by the sensors is DC coupled to a non-inverting input terminal of a first operational amplifier. An output signal of the first operational amplifier is fed back via a first feedback resistor that form a first branch of reverse feedback to an inverting input terminal of the first operational amplifier. A network that includes a capacitor in series with a second resistor is coupled between the inverting input terminal and ground. The first and second resistors and the capacitor cause the first operational amplifier to have a unity gain with respect to the DC offset and to have a predetermined high closed-loop gain with respect to the AC voltage component of the signal produced by the sensors.

An output signal of the first operational amplifier and the signal produced by the sensors are DC coupled to first and second inputs, respectively, of a second operational amplifier operating as a comparator. The second operational amplifier produces the square wave voltage in accordance with a difference between the signals at the first and second inputs.

The first operational amplifier has a unity gain with respect to the DC offset. Therefore, the DC voltage component at the output of the first operational amplifier, that is coupled to the first input of the second operational amplifier, is equal to the DC voltage component at the second input of the second operational amplifier. Because the DC voltage component at the output of the first operational amplifier corresponds in its value with the DC offset at its input, it is possible to refer the inputs of the second operational amplifier, operating as comparator, directly to this potential. The square wave signal is generated from the comparison of the amplified alternating voltage at the output of the first operational amplifier with the input signal produced by the sensors. Because the DC voltage component is approximately equal in size at both inputs of the comparator, the square wave signal is, advantageously, substantially unaffected by the DC offset.

In order to reduce a length of a transient interval, it may be desirable to obtain the steady state gain of the amplifier, such as, for example, unity gain with respect to the DC offset in the first operational amplifier, when the AC voltage component of the signal produced by the sensors reaches a peak immediately after rotation of the rotor is initiated.

In accordance with an inventive feature, two diodes coupled in an anti-parallel manner form a second reverse feedback branch that is coupled between the capacitor and the output of the first operational amplifier. Advantageously, the capacitor is immediately charged up through a current path that bypasses the first and second resistors to the potential of the unknown DC offset that is contained in the input signal of the first operational amplifier and produced by the sensors.

The size of the superimposed amplified AC voltage component at the output of the first operational amplifier is determined by the closed-loop gain that is established by the selection of the first and second resistors. It is established to be slightly smaller than the forward voltage of the anit-parallel coupled diodes that is, for example, plus/minus 0.7 volt. Therefore, advantageously, no limiting effect is caused by the diodes. The resulting peak voltage at the output of the first operational amplifier is equal to the voltage across the capacitor plus/minus the forward voltage of the diodes.

An apparatus, embodying an aspect of the invention, is responsive to an input signal containing an AC component superimposed on an offset component for generating a square wave output signal. The apparatus includes an operational amplifier responsive to the signal components of the input signal for generating an output signal of the amplifier. A feedback network is coupled to the amplifier for establishing a predetermined small signal closed-loop gain in the amplifier. A switching arrangement couples in a feedback manner the output signal to a capacitor to develop in the capacitor a voltage that is coupled to a first input terminal of the amplifier at a magnitude that is determined in accordance with the offset component. A comparator is responsive to an output signal of the amplifier and to the input signal for generating the square wave signal in accordance with a difference therebetween.

Figure 1:
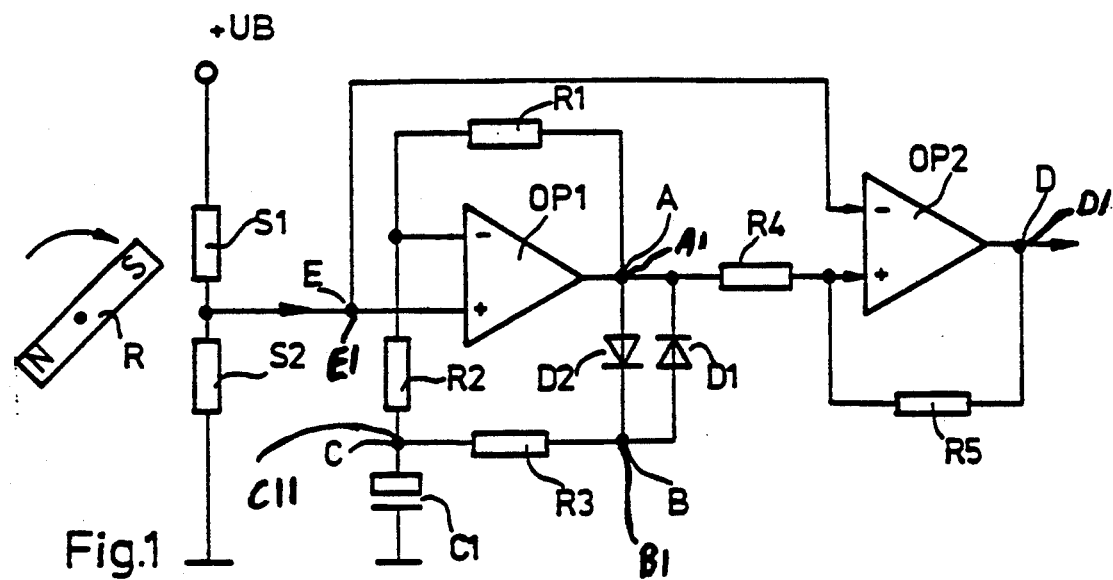
FIG. 1 illustrates a circuit diagram, embodying an aspect of the invention, for converting a sinusoidal alternating voltage having a DC offset that is generated in magnetic field sensitive sensors to a square wave voltage.

FIG. 1 illustrates in a circuit diagram, embodying an aspect of the invention, for converting sinusoidal alternating voltage E1, generated in magnetic field sensitive sensors S1 and S2, having a DC offset, to a square wave voltage. Magnetic field sensitive sensors S1 and S2 are coupled in series between a DC voltage +UB and a reference potential or ground. A rotor R of a DC motor carrying magnetic pole pairs N and S generates upon its rotation sinusoidal voltage E1 at a junction terminal E between the two sensors which contains the DC offset. The DC offset results from the DC current that flows through resistances of the sensors and generated by the applied voltage +UB. Voltage E1 that is developed at terminal E is DC coupled to a noninverting input terminal of an operational amplifier OP1 operating as an amplifier of the sinusoidal AC voltage component of voltage E1. Voltage E1 is also DC coupled to an inverting input terminal of a second operational amplifier OP2, operating as a comparator. The AC voltage amplification in amplifier OP1 is determined by means of a reverse feedback circuit arranged as an AC voltage divider. The voltage divider, embodying an inventive feature, is formed by a high-resistance resistor R1 coupled between an output terminal A and an inverting input terminal of amplifier OP1. The voltage divider includes a serial arrangement coupled to the inverting input terminal of amplifier OP1. The serial arrangement is formed by resistor R2 that is substantially smaller than resistor R1 and that is coupled in series with a capacitor C1. Capacitor C1 has an end terminal remote from the inverting input terminal of amplifier OP1 that is coupled to ground. By this reverse feedback circuit that is formed by the voltage divider, the DC voltage component present at output terminal A is coupled back to the inverting input terminal of amplifier OP1.

In steady state normal operation, capacitor C1 is charged to a voltage that is equal to the DC offset at terminal E1. Because the DC amplification of amplifier OP1 is unity or equal to one, the DC voltage component at terminal A is equal to the DC offset of voltage E1. Were it not for the effect of diodes D1 and D2 as described later on, it would have taken to charge capacitor C1 an undesirably long interval following the initiation of the rotation of rotor R. Such long interval is determined according to the large time constant defined by resistors R1 and R2 and capacitor C1. After such long interval, determined by the time constant, the steady state would have been reached in which the DC voltage developed at output terminal A is equal approximately to the DC offset present at input terminal E. Thus, it would have taken several oscillations or periods of the AC voltage component generated in sensors S1 and S2 to produce a steady state operation in which DC amplification of amplifier OP1 is unity. In order to significantly shorten this undesired long starting process, a junction terminal C, between capacitor C1 and resistor R2, is coupled to output terminal A via diodes D1 and D2, coupled in an anti-parallel manner and in series with a resistor R3.

The small signal closed-loop AC amplification or gain of amplifier OP1 is selected in such a way that the peak-to-peak magnitude of the voltage at terminal A is equal to, approximately but slightly less, twice the forward voltage of diode D1 or D2. The steady state DC voltage component of the voltage at terminal A is equal to the DC offset at terminal E. Thus, for example, the positive peak of the voltage at terminal A is greater than the DC offset at terminal E by a value that is approximately equal to 0.7 volts, the forward voltage drop of the diode. Consequently, diode D1 or D2 causes, capacitor C1 to be charged via the low internal resistance of forward biased diode D1 or D2 to a steady state level that is equal to the DC offset, immediately upon the occurrence of a first peak of the alternating voltage at terminal E that occurs following the initiation of rotation of rotor R. Thus, the voltage at terminal A contains, soon after the rotation of rotor R begins, a DC voltage component which is equal to the DC offset developed at the noninverting input terminal of amplifier OP1.

Resistor R3 is coupled in series with anti-parallel couple diodes D1 and D2. Resistor R3 has a value which is sufficiently low so that the time constant for charging capacitor C1 is not influenced in a material way. It may be possible to dispense altogether with resistor R3 and to couple directly diodes D1 and D2 to capacitor C1.

The voltage developed at terminal A is coupled via a resistor R4 to a non-inverting input terminal of a comparator or amplifier OP2. The voltage at terminal E is coupled to an inverting input terminal of comparator OP2. A resistor R5 coupled between an output terminal D of amplifier OP2 and its non-inverting input terminal improves linearity and, advantageously, provides hysteresis.

Immediately following initiation of the rotation of rotor R, after the voltage at terminal A attains a peak level for the first time, the DC voltage component at the noninverting input terminal of comparator OP2 is equal to that at the inverting input terminal of comparator OP2. Therefore, the square wave voltage at an output terminal D of comparator OP2, that is converted from the input alternating voltage at terminal E, is produced at the correct state. Because of slight lack of symmetry in the circuit, the voltage at terminal D could contain a small but constant DC voltage component at its FALSE logical state level.

The negative feedback network that includes R1 and R2 prevents amplifier OP1 from operating in an open loop manner with respect to small signal gain. Therefore, advantageously, the hysteresis that is provided in comparator OP2 is capable of preventing an amplified noise signal at terminal A from causing an erroneous change of state of the square wave signal at terminal D.

By selecting proper value for capacitor C1, the last state of the square wave voltage at terminal D can be stored or maintained for a sufficiently long period of time following an instant when rotation of rotor R stops. Thus, in case of interruption of the rotation of the rotor R of the motor, a motor commutation controlled by the square wave voltage, can be further carried out with the correct commutating phase. Such feature is particularly advantageous when such motor is used as a capstan motor in a VTR. By using magneto-resistance elements, it is possible to statically determine the relation of the magnetic pole pairs with reference to the commutating coils even at a stand-still of the motor.

Maintaining the last state of the square wave signal at terminal D following an instant when the rotor is stopped is useful for providing a slow motion picture frame display feature in a VTR. When the slow motion feature is activated, there is an interval of, for example, one second between displayed successive picture frame in which the capstan motor is stopped. To display each successive picture frame, for example, 30 pulses produced at terminal D are counted, in a well known manner, not shown. The number 30 is based on the assumption that in one revolution, the capstan motor produces 360 pulses. To provide exact counting of such 30 pulses, the last state of the square wave voltage at terminal D is maintained during the interval when the capstan motor is stopped. Advantageously, this feature is obtained by maintaining the charge in capacitor C1 during such long interval.

Figure 2A:
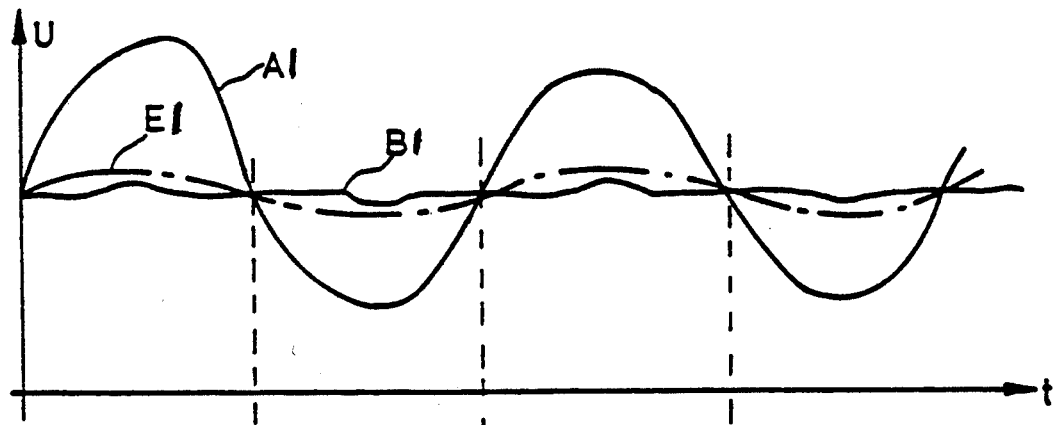
FIGS. 2a and 2b illustrate waveforms useful for explaining the operation of the circuit of FIG. 1.
Figure 2B:
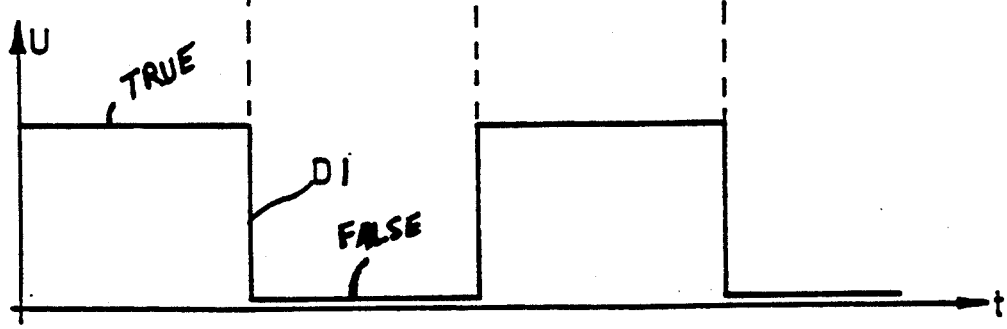
Figure 3:
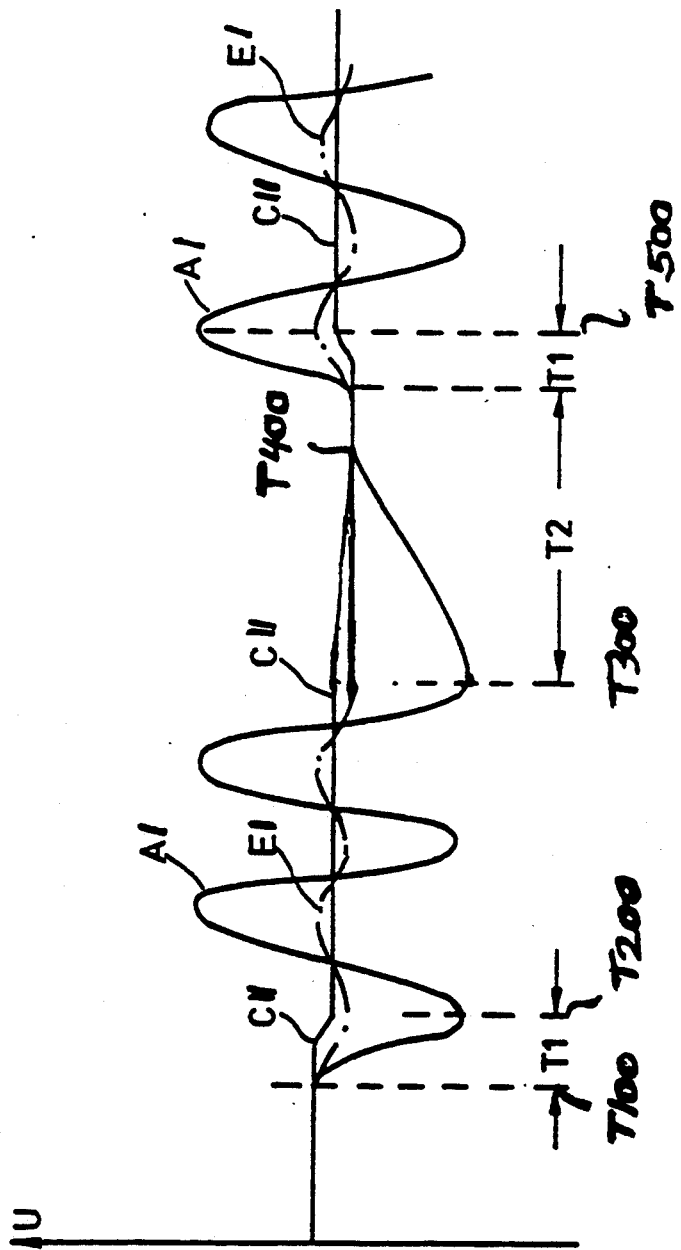
FIG. 3 illustrates additional waveforms depicting transient effects in the circuit of FIG. 1.

FIGS. 2a and 2b and 3 illustrate waveforms at different points or terminals of the circuit of FIG. 1. Similar symbols and numerals in FIGS. 1, 2a, 2b and 3 indicate similar items or functions. In FIG. 2a, it is shown that each of the waveforms E1, A1 and B1 includes a corresponding DC voltage component. Waveform E1 is the input alternating voltage at terminal E, waveform A1 is the output alternating voltage at output terminal A of the first operational amplifier OP1 and waveform B1 is the waveform at a junction terminal B, between diodes D1 and D2 and between resistor R3. FIG. 2b illustrates a square wave waveform D1 at the output terminal D of comparator OP2. However, a small DC voltage component at the FALSE state of waveform D1 which is constant in its value, can appear because of a slight lack of symmetry in the circuit and is of no significance for the operation.

Prior to initiation of the rotation of rotor R of FIG. 1, at time T100 of FIG. 3, voltage E1 is shown for explanation purposes as being at a maximum positive level. Each of voltage A1 and voltage C11 in capacitor C1 of FIG. 1 is equal to voltage E1. Following initiation of the rotation of rotor R of FIG. 1, after time T100 of FIG. 3, capacitor C1 of FIG. 1 is charged via the corresponding diode of diodes D1 and D2, as shown in waveform C11 of FIG. 3 that is developed in capacitor C1 of FIG. 1. At time T200 of FIG. 3, that occurs when voltage A1, at terminal A, or voltage E1, at terminal E, is at a negative peak level, and also at a time T500 that occurs when each of voltages A1 and E1 is at a positive peak level following an interval T2 in which the rotation ceases, voltage C11 in capacitor C1 of FIG. 1 is established via diode D1 or D2 at a level that is equal to the DC offset. The DC offset is the DC voltage component of voltage E1. Voltage C11 is equal to the DC offset because, for example, at time T200 of FIG. 3, the negative peak of voltage A1 is more negative than the DC offset at terminal E of FIG. 1 by an amount that is approximately equal to the forward voltage of diode D1, as explained before. Similarly, the positive peak of voltage A1 at time T500 of FIG. 3 is more positive than the DC offset at terminal E of FIG. 1 by an amount that is approximately equal to the forward voltage of diode D2. Thereafter, normal operation is resumed and voltage C11 of FIG. 3 in capacitor C1 of FIG. 1 remains constant and equal to the DC offset.

After an interruption of the rotation of rotor R of FIG. 1, as shown during interval T2 of FIG. 3, voltage C11 that is equal to the DC offset prior to the interruption is discharged slowly in accordance with the large time constant that is determined by resistors R1 and R2 and capacitor C1. Therefore, until voltage C11 becomes equal to voltage E1, at time T400 of FIG. 3, the output voltage of the square wave waveform at terminal D of comparator OP2 remains the same as prior to the interruption of the rotation of rotor R. Because of the large time constant, the information providing the position of the magnetic pole pairs in their relation to the sensors is stored for later control processes for a long period of time by means of the charge in capacitor C1.

In the embodiment of the circuit of FIG. 1 the following components were used:

S1, S2=magneto-resistance element DM-106 B, SONY R1=470K, R2=33K, R3=0.1K, R4=22K, R5=270K C1=47 uF, D1, D2=1N4148

What is claimed is:

1. An apparatus responsive to an input signal that is indicative of a rotation of a rotor of a motor for generating a square wave output signal that is indicative of said rotation of said rotor, comprising:

a sensor coupled to said rotor for generating said input signal containing an AC component superimposed on an offset component;

an operational amplifier responsive to said signal components of said input signal for generating an output signal of said amplifier;

a resistor feedback network coupled to said amplifier for establishing a predetermined small signal closed-loop gain in said amplifier to control an amplitude of said output signal of said amplifier;

a capacitor coupled to said feedback network for increasing said small signal closed-loop gain with respect to said AC component relative to said small signal closed-loop gain with respect to said offset component of said input signal;

switching means for coupling in a feedback manner said output signal of said amplifier to said capacitor to develop in said capacitor a voltage that is coupled to a first input terminal of said amplifier at a magnitude that is determined in accordance with said offset component; and a comparator responsive to said output signal of said amplifier and to said input signal for generating said square wave signal in accordance with a difference therebetween.

2. An apparatus responsive to an input signal that is indicative of a rotation of a rotor of a motor for generating a square wave output signal that is indicative of said rotation of said rotor, comprising:

a sensor coupled to said rotor for generating said input signal containing an AC component superimposed on an offset component;

an operational amplifier responsive to said signal components of said input signal for generating an output signal of said amplifier;

a feedback network coupled to said amplifier for establishing a predetermined small signal closed-loop gain in said amplifier to control an amplitude of said output signal of said amplifier;

a capacitor;

switching means for coupling in a feedback manner said output signal to said capacitor to develop in said capacitor a voltage that is coupled to a first input terminal of said amplifier at a magnitude that is determined in accordance with said offset component; and a comparator responsive to an output signal of said amplifier and to said input signal for generating said square wave signal in accordance with a difference therebetween, wherein said feedback network comprises a first resistor coupled between an output terminal of said amplifier and said first input terminal of said amplifier and said capacitor is coupled in series with said first resistor such that said first input terminal is coupled between said capacitor and said first resistor.

3. An apparatus according to claim 2 further comprising, a second resistor coupled in series with said capacitor such that said first input terminal is coupled between said first and second resistors.

4. An apparatus according to claim 3 wherein said closed-loop gain of said amplifier is determined in accordance with a ratio between said first and second resistors.

5. An apparatus according to claim 3 wherein said closed-loop gain of said amplifier with respect to said AC component is substantially higher than with respect to said offset component.

6. An apparatus according to claim 2 wherein said switching means comprises a pair of diodes coupled in an anti-parallel manner between said output terminal of said amplifier and said capacitor.

7. An apparatus according to claim 2 wherein said switching means has a first main current conducting terminal that is coupled between said first resistor and said capacitor and a second main current conducting terminal that is coupled to said output terminal of said amplifier.

8. An apparatus according to claim 1 wherein said offset component comprises a constant DC component and wherein different values of said DC component produce correspondingly different magnitudes of said capacitor voltage.

9. An apparatus according to claim 1 wherein said closed-loop gain of said amplifier with respect to said offset component is substantially smaller than with respect to said AC component.

10. An apparatus according to claim 1 wherein said input signal is coupled to a noninverting input terminal of said amplifier and said output signal of said amplifier is noninverted with respect to said input signal.

11. An apparatus according to claim 1 further comprising, a positive feedback network coupled to said comparator for providing hysteresis in said comparator.

12. An apparatus according to claim 1 wherein said switching means couples said capacitor to an output terminal of said amplifier during a start-up interval to develop said capacitor voltage through a signal path having a first time constant and decouples said capacitor from said output terminal after an instant when the rotation of said rotor is interrupted to form a time constant that is substantially larger than said first time constant for reducing a rate of change of said capacitor voltage so as to maintain said square wave voltage, throughout an interval that is substantially longer than a normal operation period of said input signal following said instant, at a state that is indicative of a position of said rotor prior to said instant.

13. An apparatus for converting a sinusoidal signal superimposed on DC offset component to a square wave signal, comprising;
   a source of said sinusoidal signal;
   an operational amplifier having a noninverting input terminal coupled to said source of said sinusoidal signal and responsive to said sinusoidal signal for amplifying said sinusoidal signal;
   a feedback network for establishing a closed-loop signal gain of said operational amplifier including a first resistor coupled to said operational amplifier between an output terminal and an inverting input terminal of said operational amplifier and a series arrangement of a second resistor and a capacitor that is coupled between said inverting input terminal and a common conductor;
   a pair of diodes coupled in an anti-parallel manner between said capacitor and said output terminal of said operational amplifier; and
   a comparator having a noninverting input terminal that is coupled to one of said source of said sinusoidal signal and to said output terminal of said operational amplifier and having an inverting input terminal that is coupled to the other one of said source of said sinusoidal signal and said output terminal of said amplifier for generating said square-wave signal at an output terminal of said comparator.

14. An apparatus according to claim 13 wherein said closed-loop signal gain of said operational amplifier with respect to an AC component of said sinusoidal signal is determined in accordance with values of said first and second resistors such that a peak-to-peak amplitude of an AC component of said output signal of said amplifier is approximately equal to a sum of a magnitude of a forward voltage of said first diode and a magnitude of a forward voltage of said second diode.

15. An apparatus according to claim 13 wherein said sinusoidal signal is generated in a sensor that detects a static magnetic field produced by rotating magnetic pole pairs such that an amplitude of an AC component of said sinusoidal signal is smaller than said DC offset component of said sinusoidal signal.

16. An apparatus according to claim 13 wherein a state of said square wave signal is maintained for a period of time that is determined in accordance with a time constant of said network that includes said capacitor and said first and second resistors following an instant when a motion of said magnetic pole pairs is stopped.

* * * * *